United States Patent
Khaikin et al.

(10) Patent No.: US 9,633,153 B1
(45) Date of Patent: Apr. 25, 2017

(54) METHOD, SYSTEM, AND COMPUTER PROGRAM PRODUCT FOR VERIFYING AN ELECTRONIC DESIGN USING STALL PREVENTION REQUIREMENTS OF ELECTRONIC CIRCUIT DESIGN MODELS OF THE ELECTRONIC DESIGN

(71) Applicant: Cadence Design Systems, Inc., San Jose, CA (US)

(72) Inventors: Sergey Khaikin, San Diego, CA (US); Lawrence Chunkhang Loh, Milpitas, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 155 days.

(21) Appl. No.: 14/588,287

(22) Filed: Dec. 31, 2014

(51) Int. Cl.
*G06F 17/50* (2006.01)

(52) U.S. Cl.
CPC ................ *G06F 17/5045* (2013.01)

(58) Field of Classification Search
CPC .............................. G06F 9/524; G06F 9/3838
USPC .......................................................... 716/107
See application file for complete search history.

(56) References Cited

U.S. PATENT DOCUMENTS

| | | | |
|---|---|---|---|
| 6,738,872 B2 * | 5/2004 | Van Huben et al. | ......... 711/150 |
| 7,020,856 B2 | 3/2006 | Singhal et al. | |
| 7,065,726 B1 | 6/2006 | Singhal et al. | |
| 7,137,078 B2 | 11/2006 | Singhal et al. | |
| 7,185,186 B2 * | 2/2007 | McDonald | ............... 712/238 |
| 7,203,775 B2 * | 4/2007 | Van Doren et al. | ............ 710/52 |
| 7,437,693 B1 | 10/2008 | Somaya et al. | |
| 7,437,694 B1 | 10/2008 | Loh et al. | |
| 7,461,236 B1 * | 12/2008 | Wentzlaff | ......................... 712/10 |
| 8,131,768 B2 | 3/2012 | Sinha | |
| 8,381,148 B1 | 2/2013 | Loh et al. | |
| 8,863,049 B1 | 10/2014 | Lundgren et al. | |
| 2003/0159124 A1 | 8/2003 | Fisher | |
| 2003/0217235 A1 * | 11/2003 | Rowlands | ..................... 711/141 |
| 2007/0160323 A1 | 7/2007 | Deliwala | |
| 2009/0281999 A1 | 11/2009 | Sinha | |
| 2009/0292941 A1 | 11/2009 | Ganai et al. | |
| 2010/0259536 A1 * | 10/2010 | Toksvig et al. | ............... 345/418 |
| 2013/0054852 A1 * | 2/2013 | Fuoco et al. | .................. 710/110 |

(Continued)

OTHER PUBLICATIONS

Notice of Allowance for U.S. Appl. No. 13/404,403, dated Nov. 15, 2012.

*Primary Examiner* — Suchin Parihar
(74) *Attorney, Agent, or Firm* — Vista IP Law Group, LLP

(57) ABSTRACT

Various mechanisms and approaches identify multiple cells in an electronic design and multiple sets of stall prevention requirements or multiple sets of transactions for the multiple cells and determine dependencies between stall prevention requirements. A graph is constructed to represent the dependencies and the stall prevention requirements or the transactions involved in the dependencies by using the stall prevention requirements or the transactions as the nodes and the dependencies as the arcs connecting the nodes in the graph. One or more loop analyses are performed on the graph to identify one or more loops as one or more potential deadlocks. False deadlocks may be eliminated from further processing. The analyses and deadlock detection may be independently performed for each cell in sequence or in parallel to divide and conquer a complex electronic system design.

21 Claims, 11 Drawing Sheets

(56) References Cited

U.S. PATENT DOCUMENTS

2015/0016257 A1* 1/2015 Kumar et al. ................ 370/235
2015/0347196 A1* 12/2015 Truong et al. ................ 716/107

* cited by examiner

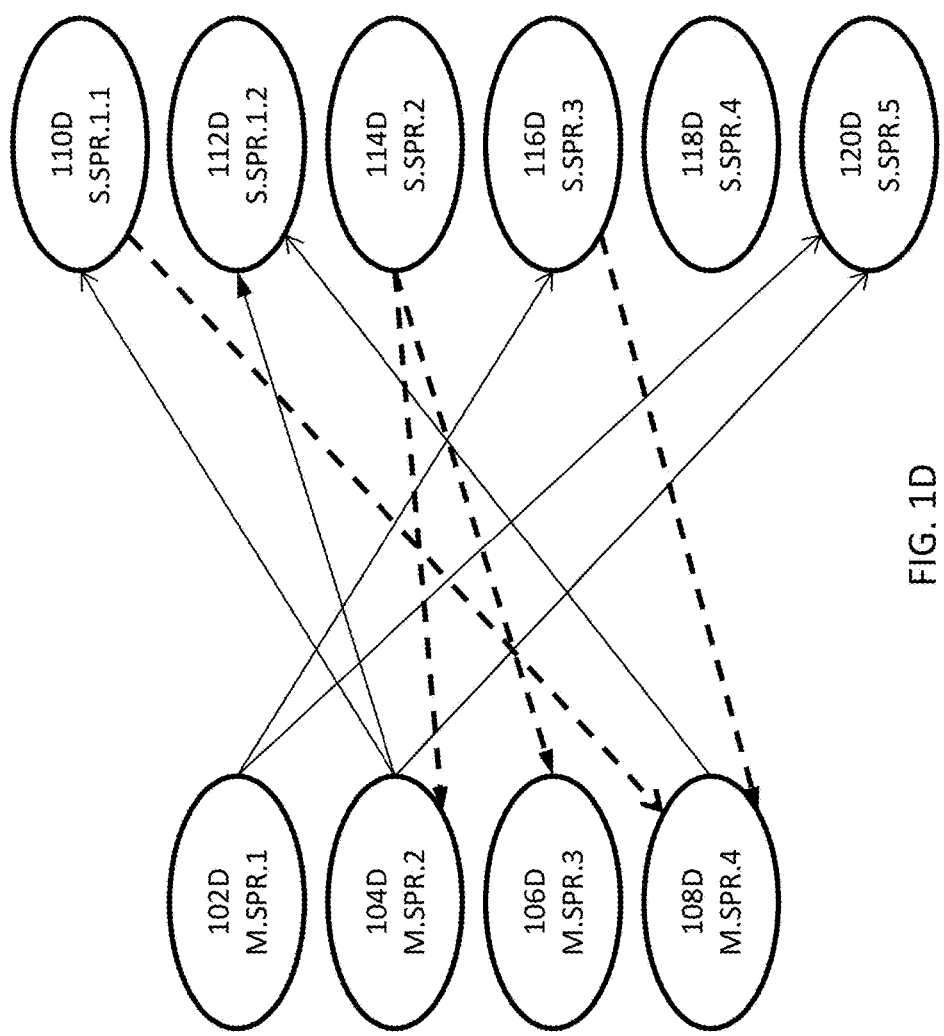

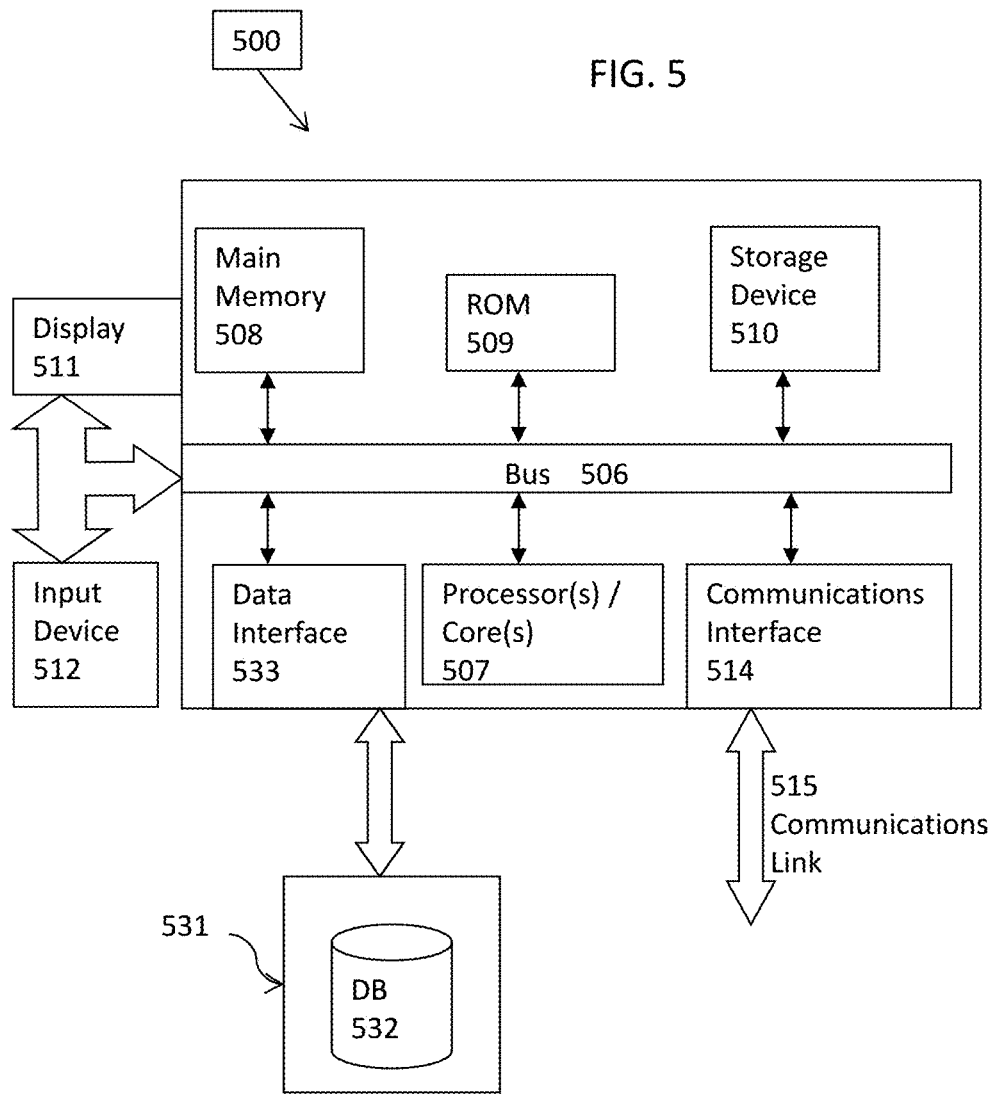

METHOD, SYSTEM, AND COMPUTER PROGRAM PRODUCT FOR VERIFYING AN ELECTRONIC DESIGN USING STALL PREVENTION REQUIREMENTS OF ELECTRONIC CIRCUIT DESIGN MODELS OF THE ELECTRONIC DESIGN

CROSS REFERENCE TO RELATED PATENT APPLICATION

This patent application is related to U.S. Pat. No. 8,381,148 entitled "FORMAL VERIFICATION OF DEADLOCK PROPERTY" and filed on Feb. 24, 2012 and issued on Feb. 19, 2013. The content of the aforementioned U.S. patent is hereby expressly incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Modern electronic circuit design such as system-on-chip (SoC) devices or integrated circuit designs have been used in a wide range of systems, ranging from mobile computing devices to automotive control systems. These modern electronic circuit designs often present complex system issues that may be difficult and time consuming to identify and resolve, even for experienced design verification engineers. These issues include verifying whether one or more subsystems of an electronic circuit design operate as designed as well as stressing subsystem interfaces to fully characterize and verify transaction flows between multiple subsystems. While verification tools have improved, current verification methods still require significant expertise and experience to prove or disprove a property efficiently and effectively. In some cases, the slow convergence in conventional verification processes of electronic circuit designs often delays or impedes the identification and hence debug or fix of verification bottlenecks.

Moreover, SoC architectures are usually susceptible to system-level deadlocks due to layering of different interconnects and integration of pre-existing intellectual property (IP) blocks. A dead-lock free architecture or protocol of an individual IP block does not necessarily imply a deadlock-free implementation of the SoC at the system level including individual IP blocks, discrete components, and interconnections therefor. Corner case behaviors in these SoC designs as well other complex electronic circuit designs are extremely difficult to detect at the system level with conventional verification approaches.

Therefore, there is a need to improve the performance, efficiencies, and effectiveness of conventional verification techniques.

SUMMARY

Disclosed are method(s), system(s), and article(s) of manufacture for detecting or analyzing system level deadlocks of an electronic design using stall prevention requirements of electronic circuit models for the electronic design in one or more embodiments. One or more embodiments are directed at a method for detecting or analyzing system level deadlocks of an electronic design using stall prevention requirements of electronic circuit models for the electronic design. In these one or more embodiments, the method may identify one or more blocks or cells of circuit component designs of an electronic design and one or more sets of stall prevention requirements corresponding to the one or more blocks or cells, determine dependencies between stall prevention requirements, determine a graph for the dependencies with the at least one processor that correlates the stall prevention requirements with one another, and verify the electronic design with the at least one processor that performs one or more loop analysis on the graph to detect one or more potential deadlocks.

In some of these embodiments, the electronic design model comprises a register transfer level (RTL) electronic design, and the one or more blocks of circuit component designs are interconnected in a switch fabric at a system level of the register transfer level electronic design. In some of these embodiments, one or more forward progress requirements for interconnects connecting the one or more blocks or cells may be identified, and one or more environment stall conditions may be identified by using the at least one processor that proves or disproves the one or more environment stall conditions. In some of the immediately preceding embodiments, the method may further include the act of identifying a first block from the one or more blocks and identify a first transaction for data transport involving the first block with the at least one processor that identifies a first specification of data in the data transport entering or exiting the first block.

In addition, the method may optionally identify one or more other transactions for one or more other blocks with the at least one processor that identifies a specification of the data in the data transport entering or exiting the one or more other blocks and optionally determine dependencies between the first transaction for the data transport involving the first block and the one or more other transactions for the data transport involving the one or more other blocks in the electronic design in some of the immediately preceding embodiments.

In some embodiments, the method may include the act of identifying a first block from the one or more blocks and the act of identifying a stall prevention requirement for the first block with the at least one processor that transforms an environment stall condition of the one or more environment stall conditions into the stall prevention requirement. In some of the immediately preceding embodiments, the method may include the act of identifying an unblocking event corresponding to the stall state with the at least one processor that processes the environment stall condition to retrieve the unblocking event associated with or in the environment stall condition, the act of transforming information about the stall state into a precondition of the stall prevention requirement, and the act of transforming information about the unblocking event into an implication of the stall prevention requirement.

In addition or in the alternative, the act of determining the dependencies may be performed sequentially for the one or more blocks in the electronic design, the one or more blocks includes at least one cell that has been proven to perform the data transport across or in the at least one cell is deadlock free, and the data transport that is deadlock free across or in the at least one cell does not ensure that the data transport in or out of the at least one cell in the electronic design is deadlock free. The method may also optionally include the act of identifying one or more other stall prevention requirements for one or more other blocks with the at least one processor that transforms one or more other environment stall conditions of the one or more environment stall conditions for the one or more other blocks into the one or more stall prevention requirements in some embodiments.

In some of these immediately preceding embodiments, the method may also include the act of determining dependencies between the stall prevention requirement for the first block and the one or more other stall prevention requirements for the one or more other blocks in the electronic design. In determining the graph, the method may include the act of determining a plurality of nodes in the graph with the at least one processor that identifies and transforms the stall prevention requirement and the one or more other stall prevention requirements into the plurality of nodes and the act of determining a plurality of arcs connecting the plurality of nodes in the graph with the at least one processor that identifies and transforms the dependencies into the plurality of nodes.

In some embodiments, the method may optionally detect one or more potential deadlocks in the electronic design with the at least one processor that performs one or more loop analyses on the graph and identifies the one or more potential deadlocks based in part or in whole upon results of the one or more loop analyses. In some of the immediately preceding embodiments, the method may include an act of identifying zero or more false deadlocks in the electronic design with the at least one processor that examines the one or more potential deadlocks to identify the zero or more false deadlocks, and an act of trimming a processing space to a smaller processing space with the at least one processor that eliminates the zero or more false deadlocks from further processing and reports one or more remaining potential deadlock for debugging, analysis, or fixing.

Some embodiments are directed at a hardware system that may be specially configured to perform any of the methods, processes, or sub-processes disclosed herein to improve the efficiencies (e.g., with a shorter runtime, a smaller number of computations or processor cycles, etc. for verification tasks), improve the effectiveness (e.g., by eliminating false deadlocks, by partitioning a complex electronic design into multiple smaller partitions and analyzing the multiple smaller partitions sequentially or in parallel), and/or performance (e.g., shorter runtime due to the elimination of false deadlocks or by partitioning a complex electronic design into multiple, smaller partitions to enable faster analyses, etc.) of verification tasks.

The hardware system may include at least one processor or at least one processor core, which executes one or more threads of execution and is coupled to a system bus architecture and an external bus architecture to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 1D illustrates a simplified dependency diagram of a simplified electronic design in one or more embodiments.

FIG. 5 illustrates a computerized system on which a method for verifying an electronic design using stall prevention requirements of electronic design circuit models of the electronic design may be implemented.

DETAILED DESCRIPTION

Figure 1A:
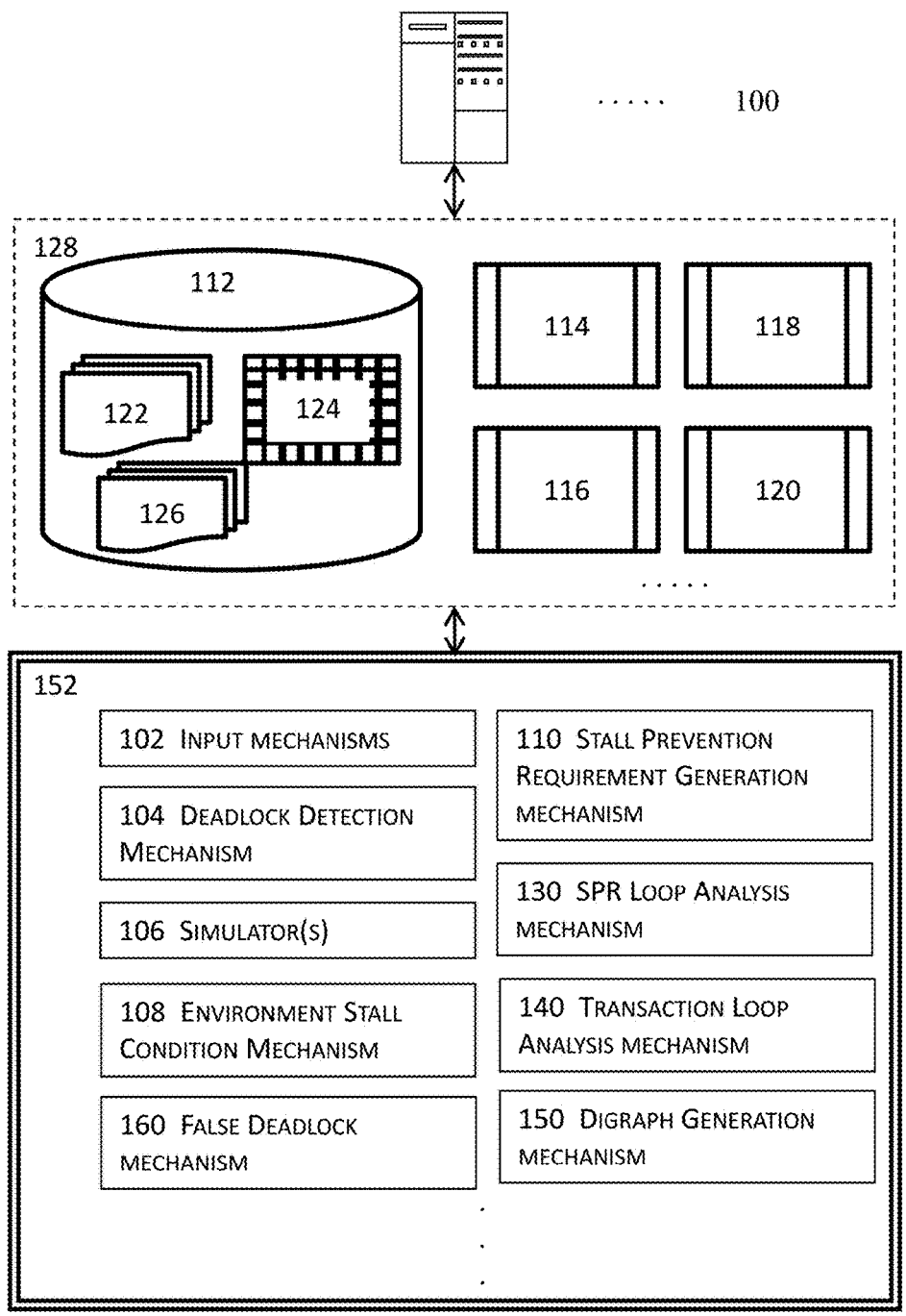
FIG. 1A illustrates a high level block diagram for a system for verifying an electronic design using stall prevention requirements of electronic design circuit models of the electronic design in one or more embodiments.

Various embodiments of the invention are directed to methods, systems, and computer program products for verifying an electronic design using stall prevention requirements of electronic design circuit models of the electronic design. Some of these mechanisms described herein detect or analyze system level deadlocks in an electronic design using stall prevention requirements of electronic circuit models of the electronic design. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention.

Further, various embodiments encompass present and future known equivalents to the components referred to herein by way of illustration. It shall be further noted that the features and advantages described in the specification are not all inclusive and, in particular, many additional features and advantages will be apparent to one of ordinary skill in the art in view of the drawings, specification, and claims. Moreover, the language used in the specification has been principally selected for readability and instructional or explanatory purposes, and may not have been selected to delineate or circumscribe the inventive subject matter.

In various embodiments, various techniques described herein may be applied to electronic designs of various abstractions. For example, these techniques may be applied to a registered transfer level (RTL) electronic design or other abstractions during the early stage of the electronic design development cycle and receive an RTL model of an electronic design as an input and apply various techniques described herein to verify the RTL level electronic design by using circuit design component models of the RTL level electronic design. Various techniques perform system level verifications on system level architectures to analyze and detect potential, system level deadlocks that may arise due to, for example, multiple layering of different interconnects and/or integration of existing intellectual property (IP) blocks.

These techniques not only ensure that the architectures and protocols used in a system design are deadlock free but also ensure that the implementations with these architectures and protocols are also deadlock free. In various embodiments described herein, forward progress requirements for interconnects may be determined at the system level of an electronic design, and legal or known environment stall conditions may be identified by using a first graph that describes how a verification mechanism or approach (e.g., the assume-guarantee approach) is applied to certify deadlock free operations of the electronic design.

The legal or known environment conditions may be transformed into stall prevention requirements by using the stall states and the unblocking events associated with or in the legal or known environment conditions. A first block or cell of a plurality of blocks or cells in the electronic design may be identified for subsequent independent analyses or processing. The plurality of blocks or cells may be processed sequentially or in parallel by using a transaction-based or a stall prevention requirement-based approach. Dependencies may be determined between the stall prevention requirements of the first block or cell and the stall prevention requirements of one or more other blocks or cells in the electronic design.

In some embodiments, the electronic design may be partitioned into multiple partitions, each of which includes a number of blocks or cells that is not to exceed a predetermined threshold number. In some of these embodiments based on stall prevention requirements, the predetermined threshold number is two or three. By examining each of the first stall prevention requirements of the first block or cell against each of the stall prevention requirements of the one or more other blocks or cells, corner cases may be easily identified, and guesswork as to which corner cases should be included in further analyses or processing may be eliminated. The determined dependencies may be stored in a data structure such as a system level dependency data base. A digraph may be constructed with the stall prevention requirements as the nodes and the dependencies as the arcs connecting the nodes of the digraph. Potential deadlocks may be identified by performing one or more loop analyses on the digraph to identify one or more loops in the digraph. False deadlocks may also be identified and further eliminated to reduce the processing space (e.g., the number of deadlocks for debugging, fixing, or analyses).

Various embodiments will now be described in detail with reference to the drawing figures. In one or more embodiments, FIG. 1A illustrates a high level block diagram for a system for verifying an electronic design using stall prevention requirements of electronic design circuit models of the electronic design and may comprise one or more computing systems 100, such as a general purpose computer described in the System Architecture Overview section to implement one or more special proposes. In some embodiments, the one or more computing systems 100 may invoke various system resources such as the processor(s) or processor core(s), memory, disks, etc. via its system bus and/or the external bus.

The one or more computing systems 100 may also initiate or interact with other computing systems via one or more networks to access various resources 128 that may comprise a floorplanner, a global routing engine, and/or a detail routing engine 114, a layout editor 116, a design rule checker 118, a sign-off mechanism 120, etc. The one or more computing systems 100 may further write to and read from, via an external bus architecture, a local or remote volatile or non-volatile computer accessible storage 112 that stores thereupon data or information such as, but not limited to, one or more databases (124) such as one or more dependency databases, one or more design databases, and/or electronic circuit design specification database(s), various statistics, various data, rule decks, various design rules, or constraints, etc. (122), dependency graphs (e.g., a directed graph or digraph), or other information or data (126) that may be used to facilitate the performance of various functions to achieve the intended purposes.

In some embodiments, the one or more computing systems 100 may, either directly or indirectly through various resources 128, which reside on the one or more computing system 100 or on one or more other computing systems, invoke a verification suite including various software, hardware modules, or combinations thereof 152 that may comprises a one or more input mechanisms 102 to input various data or information including, for example, electronic designs of an electronic system and various electronic circuit design blocks to be verified, address maps, constraints, properties or assertions, topological data of electronic designs, etc. The verification suite 152 may also include a deadlock detection and capture mechanism 104 to detect and capture information or data about deadlock conditions.

A deadlock condition includes a scenario or symptom that occurs when two or more processes fail to complete because each of the two process continues to wait for the other process to complete or to release a resource. The verification suite 152 may also comprise one or more simulators 106 to simulate, for example, the behavior of the electronic design or a portion thereof under certain payload. For example, the verification suite 152 may invoke a simulator to perform a ternary simulation on the RTL (register transfer level) design to determine whether a flop or an internal signal may retain its value regardless of activities in the corresponding active ports. As another example, the verification suite 152 may simulate an electronic design (e.g., a system on chip or SoC) design with respect the one or more RTL configuration constraints.

The verification suite 152 may include one or more environment stall condition mechanism 108 to identify environment stall conditions, one or more stall prevention requirement (SPR) mechanisms 110 to generate stall prevention requirements. The verification suite 152 may also comprise an SPR loop analysis mechanism 130 to perform one or more loop analyses on, for example, dependencies among SPRs to identify loops. The verification suite 152 may also optionally comprise a transaction loop analysis mechanism 140 to perform one or more loop analyses on, for example, dependencies among natural language-based transactions to identify loops.

A graph generation mechanism 150 (e.g., a directed graph or a digraph) generation mechanism may also be included in the verification suite 152 to generate graphs for dependencies among SPRs, or transactions, etc. More details about the mechanisms in 152 will be described in subsequent paragraphs with reference to at least FIGS. 1B-4B. A transaction may include or be associated with a transaction definition or specification which describes, among other information or data, a deadlock property that is defined based in part or in whole upon forward progress in some embodiments.

In some of these embodiments, a deadlock verification may be detected as a liveliness property that tracks a specific transaction entering and/or exiting a circuit component or block. In these embodiments, the processor cycle times or the computation resources may be reduced or saved during verification by including a finite latency in the transaction definition or specification to describe a latency threshold as the longest congested for new activity or task to appear on an egress port. The latency may be extracted from, for example, the RTL or may be determined empirically to identify the latency that allows the verification of a property. In these embodiments, a deadlock condition includes the symptom of the proof of absence of a transaction exiting a circuit block or a circuit component by using, for example, a tracker that tracks forward progress of the transaction or an action signal indicating the completion of the transaction or the transaction's exiting a circuit block or component.

One of the advantages of the determination and analyses of dependencies at the transaction level for deadlock detection and analyses is that transaction level dependencies and analyses may be described in a natural language and may thus be easier to understand by designers. Another advantage is that transaction level determination and analyses are performed at a higher level and thus require less understanding of, for example, stall prevention requirements, their meanings, etc. One of the advantages of the determination and analyses of dependencies with the stall prevention requirements for deadlock detection and analyses is that it is easier to describe the mechanisms involved in executable or machine readable formats for automation processes.

Another advantage of the determination and analyses of dependencies with the stall prevention requirements for deadlock detection and analyses is that the electronic design may be usually partitioned in such a way that each partition from the partitioning mechanism usually does not span across more than two immediately connected blocks (e.g., no more than two IP blocks interconnected with interconnects and zero or more discrete components). On the other hand, determination and analyses at the transaction level may result in a partition spanning across more than two immediately connected blocks. Another advantage of the determination and analyses of dependencies with the stall prevention requirements for deadlock detection and analyses is that it is easier to construct, maintain, store, and/or analyze the dependency graphs from the stall prevention requirements in executable or machine readable formats.

Figure 1B:
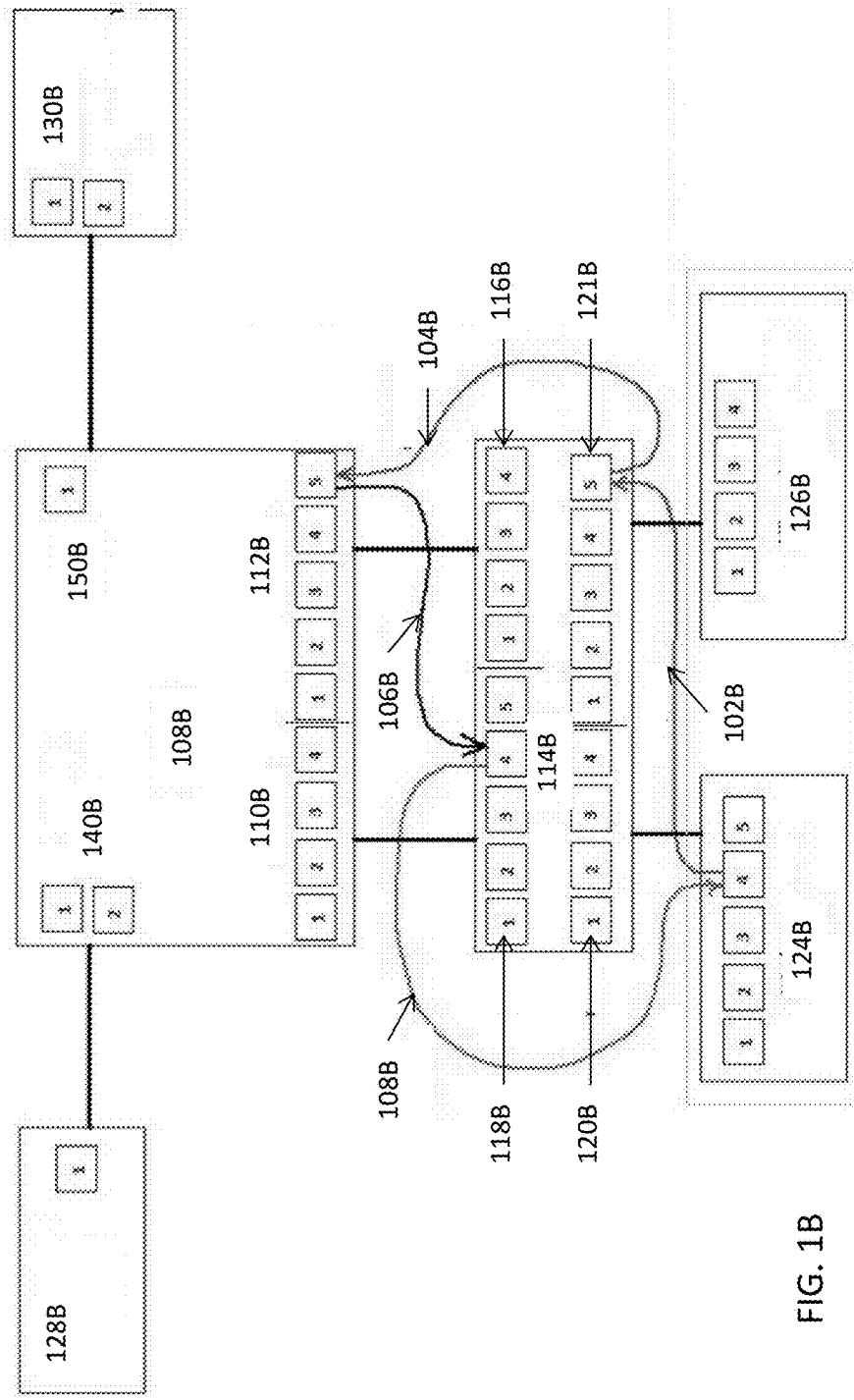
FIG. 1B illustrates a graphic example of a loop analysis to analyze dependencies in the switch fabric of a simplified system on chip design in one or more embodiments.

FIG. 1B illustrates a graphic example of a loop analysis to analyze dependencies in the switch fabric of a simplified system on chip design in one or more embodiments. More specifically, FIG. 1B illustrates an identified loop from the dependencies of the simplified electronic design by a loop analysis. The more complete dependencies are shown in FIG. 1E. In these embodiments illustrated in FIGS. 1B and 1E, dependencies between stall prevention requirements may be determined by using mechanisms described with reference to, for example, FIGS. 2-4B. The determined dependencies shown in FIG. 1E may be analyzed (e.g., by performing one or more loop analyses on a digraph determined from the dependencies) to identify one or more loops as the loop 102B-104B-106B-108B illustrated in FIG. 1B.

It shall be noted that FIG. 1E shows only a partial set of dependencies between the stall prevention requirements of various device components in the simplified electronic design, and that the full set of dependencies these illustrated devices may appear more complex that what FIG. 1E shows. It shall also be noted that the representation of these dependencies illustrated in FIG. 1E constitutes only one way of representing dependencies in some embodiments. In some other embodiments, dependencies may be illustrated in various other textual, tabular, graphical, or any other suitable formats. For example, the representation for a dependency of A depends on B may include a textual format of "A, B", "B, A", "A→B", "B→A" (A, B), (B, A), "A: B", "B: A", etc., a graphical or tabular format, or any other format. It shall further be noted that the same simplified electronic design is illustrated in both FIGS. 1B and 1E, and thus these two figures will share the same reference numerals that are described with reference to FIG. 1B.

For the ease of illustration and explanation, it is assumed that the master AXI blocks are subject to the stall prevention requirements including one or more requirements that require a master AXI port to send a write access (AW) if a write response (W) has been sent, to send a write response if a write access has been sent, to accept a read response (e.g., "RVALID"), and/or to accept a write response (e.g., "BVALID"). Slave AXI stall prevention requirements may include requirements that require a slave AXI port to accept a write access unless there is a pending write access, to accept a read access (AR) unless there is a pending read access, to accept a write response if there is an outstanding write access, to send a read response (R) if there is an outstanding write access, and/or to send B if there is an outstanding and completed write access.

The master AHB SPR requirements may include the requirements that require an AHB master to use the sequential type of transfer if the AHB master is "BUSY" (e.g., the condition holds true: "if HTRANS==BUSY, eventually HTRANS=SEQ"). Slave AHB SPRs may include requirements that there will be "HREADY" (e.g., transfer is complete) if there is an outstanding read request, and/or that there will be "HREADY" if there is an outstanding write request. It shall be noted that the aforementioned protocols are provided for explanation and ease of illustration purposes and are not intended to limit the scope of the claims or the scope of various other embodiments including other protocols (e.g., the OpenCores Wishbone bus protocol, the open core protocol, Quick Path protocol, or the Hyper Transport protocol, etc.) The directions of the arrowheads 102B, 104B, 106B, and 108B indicate the dependencies. For example, 124B.4 depends on 121B.5 for dependency 102B having the arrowhead pointing toward 121B.5; 121B.5 depends on 112B.5 for dependency 104B having the arrowhead pointing toward 112B.5; 112B.5 depends on 118B.4 for dependency 106B having the arrowhead pointing toward 118B.4; and 118B.4 depends on 124B.4 for dependency 108B having the arrowhead pointing toward 124B.4.

The electronic design illustrated in FIG. 1B includes a master cell 128B operatively connected to, for example, the AHB (AMBA High-Performance Bus) in a first fabric 108B (e.g., an interconnect fabric). The first fabric 108B may also include the AHB master 150B operatively connected to another AHB slave 130B. The AHB slave 140B in the first fabric 108B may be operatively connected to the master cell 128B. The first fabric 108B may also comprise the AXI (Advanced eXtensive Interface) master 110B and the AXI slave 112B. The electronic design further includes the second fabric 114A including the AXI slave 118B, which is operatively connected to the AXI master 110B in the first fabric 110B, the AXI master 120B, which is operatively connected to another AHB slave cell 124B in the electronic design, the AXI master 116B, which is operatively connected to the AHB slave 112B in the first fabric 108B, and the AXI master 121B in the second fabric 114B.

The AXI master 120B in the second fabric 114B may be operatively connected to another AXI slave cell 124B; and the AXI slave 126B may be operatively connected to the AXI master 121B in the second fabric 112B. It shall be noted that in the above notations, a master or a master cell indicates a master port of an IP block corresponding to a specific protocol. For example, the AXI slave 124B represents an IP block having one or more slave ports with the AXI protocol; and the AXI master 121B represents an IP block having one or more master ports with the AXI protocol.

In these embodiments illustrated in FIG. 1B, dependency 102B indicates that the AXI master port 121B in the second fabric 114B may block the read response on the AXI slave port 124B until the AXI master port 121B receives a valid write response (e.g., "BVALID") on the master port. Dependency 104B indicates that the AXI slave port 121B in the second fabric 114B may provide a write response to the AXI slave port 112B in the first fabric 108B only after the receipt of the corresponding write response from the AXI slave port 124B. Dependency 106B indicates that the AXI slave port 112B in the first fabric 108B may block a write response to the AXI slave port 118B until the AXI slave port 112B in the first fabric 108B receives a read request from the AXI slave port 121B in second fabric 114B.

Furthermore, dependency 108B indicates that the AXI slave port 118B in the second fabric 114B may provide a read response (e.g., RVALID) to the AXI slave port 112B in the first fabric 108B only after the AXI slave port 118B in the second fabric 114B receives the corresponding read response from the AXI slave port 124B. As it may be clearly understood by FIG. 1B and the description above, these four illustrated dependencies form a loop and results in circular reasoning and hence a possible deadlock situation because these devices involved in the loop will be waiting for each other to complete or to release the resources before these device may make any forward progress.

Figure 1C:
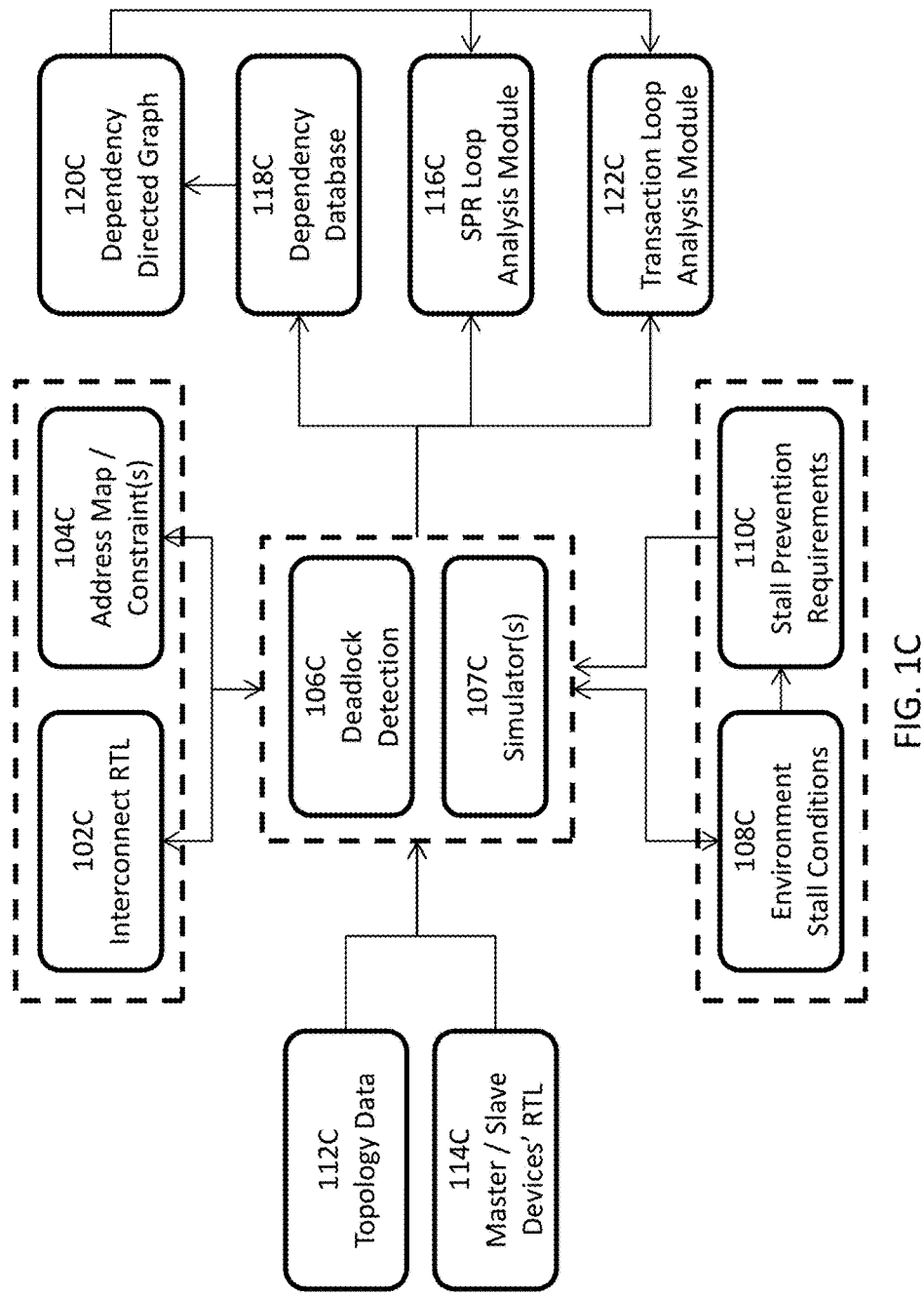
FIG. 1C illustrates a high level block diagram for interactions among various mechanisms for verifying an electronic design using stall prevention requirements of electronic design circuit models of the electronic design in one or more embodiments.
Figure 1E:
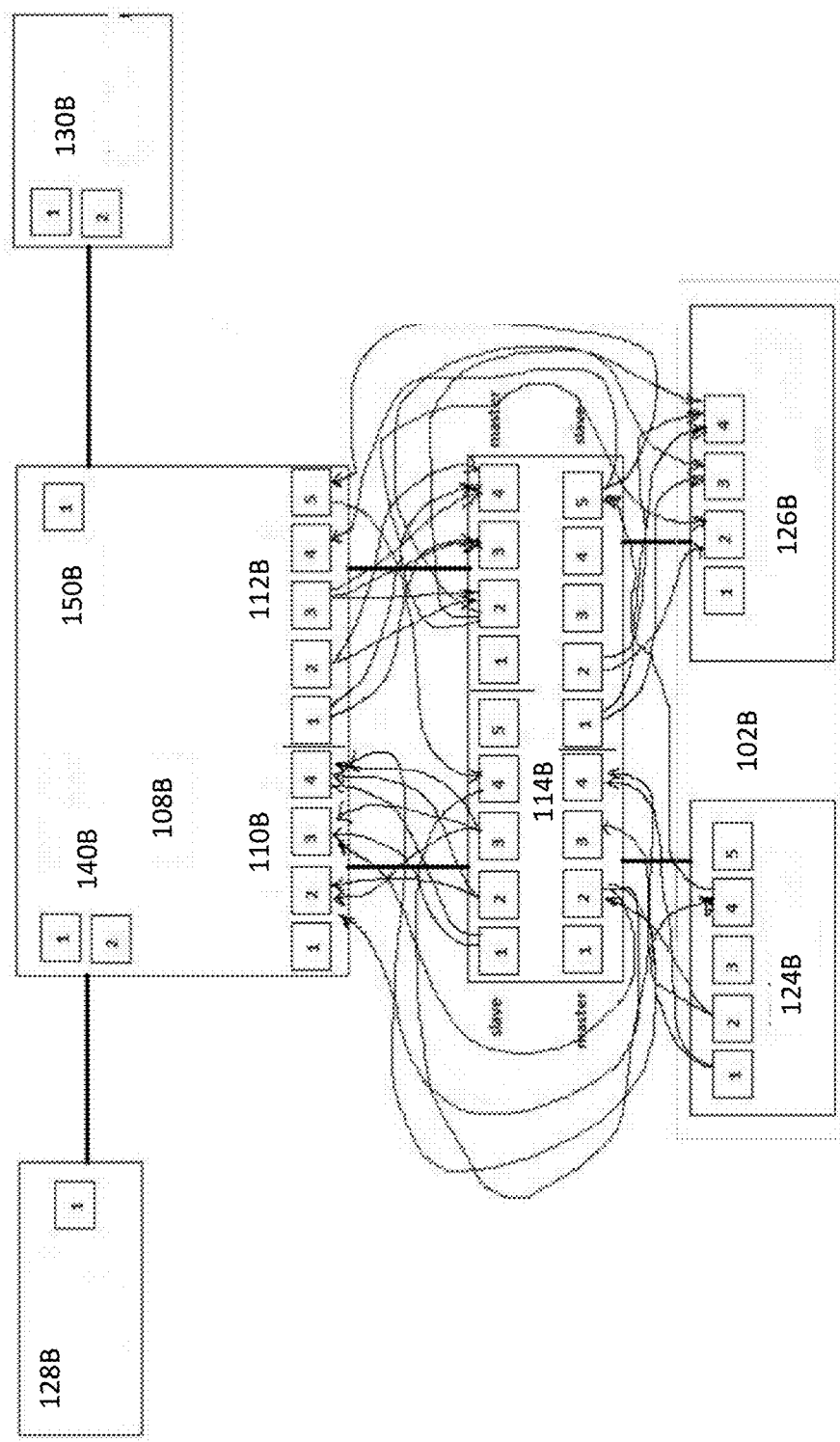
FIG. 1E illustrates a partial and incomplete set of dependencies between various device components in the same simplified electronic design illustrated in FIG. 1B.

FIG. 1C illustrates a high level block diagram for interactions among various mechanisms for verifying an electronic design using stall prevention requirements of electronic design circuit models of the electronic design in one or more embodiments. A verification tool (e.g., the verification suite 152 of FIG. 1A) may receive an electronic design 102C at an abstraction level and an address map and/or a set of constraints 104C. In some embodiments, the electronic design at the abstraction level may include the interconnect portion of an electronic circuit design (e.g., an SoC design) at the system level in the interconnect fabric or the switch fabric.

At the system level, the electronic circuit design includes a plurality of blocks of electronic circuit design components (e.g., IP blocks), discrete components, and interconnects interconnecting the plurality of blocks and discrete components. The set of constraints may include constraints regarding how one or more ports on an interface of an electronic circuit design block is enabled or disabled, whether some internal logic may remain quiet for a period of time or forever, one or more assertions, one or more properties to aid the verification flow, etc. The constraints may also be used in a simulator to determine the behavior of the electronic circuit design in some embodiments.

The address map includes information of various ports, pins, or pads, etc. for the verification tool to identify and/or bind various pieces of information or data to these various ports, pins, or pads. The electronic circuit design 102C and the address map and/or the set of constraints 104C may be received as inputs at a deadlock detection mechanism 106 and/or the simulator 107C of the verification suite. The deadlock detection mechanism 106 and/or the simulator 107C may use these inputs to identify, for example, environment stall conditions alone or in conjunction with the 108C.

The verification flow may include the identification of one or more environment stall conditions at 108C and the determination of one or more stall prevention requirements based in part or in whole upon the one or more identified environment stall conditions at 110C. An environment stall condition includes a scenario where a legal or known deadlock or stall symptom is observed, but the interconnects at the system level are not the culprit or cause of the stall or deadlock. For example, a slave client device accepts a read request from an interconnect but has not responded to the read request.

In this example of an environment stall condition, the interconnect may block other incoming requests until the outstanding read request has been served and is thus not the cause of this deadlock or stall symptom because it is the slave device that has not responded to the read request although the interconnect appears to block further requests. As another example of an environment stall condition, a master client device sends write data ahead of issuing a write request, and the write request thus has not appeared. In this latter example, the stall or deadlock symptom has been observed because the interconnects may block the write data. Nonetheless, the interconnects are not the cause of the observed deadlock or stall symptom because it is the master client device that fails to send the write request prior to sending the write data. The identified environment stall conditions may be translated, compiled, or otherwise transformed into stall prevention conditions stall prevention requirements.

The verification flow may include receiving an input of topological data 112C at the deadlock detection mechanism 106C to generate dependencies which may be populated into a dependency database 118C. The deadlock detection mechanism 106C and/or the one or more simulators 107C may further generate a digraph 120C with the stall prevention requirements 110C and use the digraph 120C and the dependencies in the dependency database to perform one or more loop analyses with the SPR loop analysis mechanism 116C or the transaction loop analysis mechanism 122C. In determining the dependencies and populating the dependency database with the dependencies, the verification flow may also include receiving the electronic designs of master and slave devices 114C in an electronic circuit design (e.g., an SoC design) as inputs at the deadlock detection mechanism 106C and/or the one or more simulators 107C to generate the dependency digraph 120C that is in turned used for either an SPR-based or a transaction-based loop analysis to identify loops from the dependencies for detection and analyses of deadlock or stall conditions.

FIG. 1D illustrates a simplified dependency diagram of a simplified electronic design in one or more embodiments. The left-hand side of FIG. 1D includes four stall prevention requirements 102D, 104D, 106D, and 108D corresponding to a master device. These four stall prevention requirements of the master device design dependent on six stall prevention requirements 110D, 112D, 114D, 116D, 118D, and 120D of a slave device design. As described herein, each block or cell of electronic circuit designs may be associated or include its own set of stall prevention requirements. For example, the master device design may include the set of stall prevention requirements including 102D "M.SPR.1", 104D "M.SPR.2", 106D "M.SPR.3", and 104D "M.SPR.2". The slave device design may also include or be associated with its own stall prevention requirements including 110D "S.SPR.1.1", 112D "S.SPR.1.2", 114D "S.SPR.2", 116D "S.SPR.3", 118D "S.SPR.4", and 120D "S.SPR.5".

An arrowhead connecting two stall prevention requirements indicates a direction of dependency between the two stall prevention requirements connected with the arrowhead. For example, the stall prevention requirement 102D of the master device design is connected with two arrowheads—the first from 102D to 116D indicating 102D depends on 116D, and the second pointing from 102D to 120D indicating 102D also depends on 120D. The dependencies represented in the dashed line type indicate the dependencies from the slave device design stall prevention requirements to the master device design stall prevention requirements. For example, the dashed arrowhead pointing from 110D to 108D indicates that the stall prevention requirement 110D of the slave device design depends on the stall prevention requirement 108D of the master device design.

Figure 2:
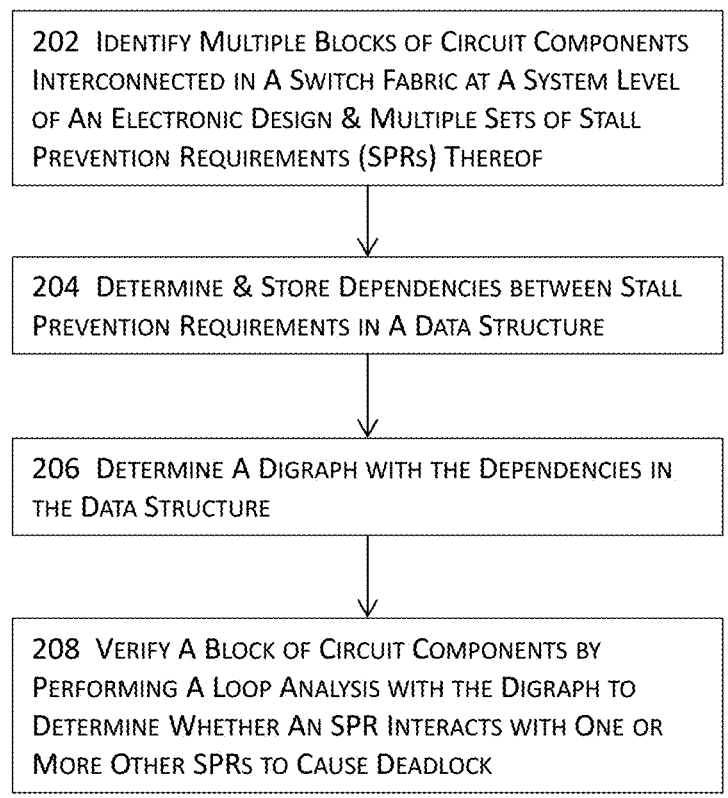
FIG. 2 illustrates a high level block diagram for a method or system for verifying an electronic design using stall prevention requirements of electronic design circuit models of the electronic design in one or more embodiments.

FIG. 2 illustrates a high level block diagram for a method or system for verifying an electronic design using stall prevention requirements of electronic design circuit models of the electronic design in one or more embodiments. In these one or more embodiments illustrated in FIG. 2, a plurality of blocks of circuit components may be identified at 202. These plurality of blocks may be interconnected with each other by interconnects in a switch fabric at a system level of an electronic design. The electronic design may comprise a multi-system system-on-chip (SoC) design and may be at various abstraction levels including some abstractions at one or more early stages of an electronic design flow such as an RTL or register transfer level design.

In addition, multiple sets of stall prevention requirements (SPRs) may be identified at 202. In addition or in the alternative, one or more data transport properties may be identified at 202. A stall prevention requirement may be generated from one or more forward progress requirements in some embodiments. A forward progress requirement may include, for example, one or more functional requirements, one or more bus compliance requirements, one or more deadlock free requirements, or any combinations thereof. A forward progress requirement may be protocol specific and may be expressed as an outstanding event indicator, a forward progress condition, an environment stall condition, an expected latency, or any combinations thereof.

For example, a forward progress requirement may be specified as: OUTSTANDING_EVENTS|→##[latency] FORWARD_PROGRESS||ENV_STALL. In these embodiments, stall prevention requirements may also be protocol specific, and thus blocks corresponding to different protocols may include or be associated with different sets of stall prevention requirements. For example, a first block of circuit components with the AXI Coherency Extensions (ACE) protocol, a second block of circuit components with the Advanced eXtensive Interface (AXI) protocol, a third block of circuit components with the Advanced Peripheral Bus (APB) protocol, and a fourth block of circuit components with the AMBA High-Performance Bus (AHB) protocol may include or be associated with four different sets of stall prevention requirements. In one or more embodiments, each block of circuit components may include or be associated with the set of stall prevention requirements corresponding to the block.

In some of these one or more embodiments, each block may also be called an "agent" for which a port model may be created with the corresponding protocol. The port model may then include or be associated with the corresponding set of stall prevention requirements. A data transport property may describe, indicate, or is otherwise related to how data flows through in the electronic design in some embodiments. A data transport may track data movement from payload to payload (e.g., data or transaction entering or exiting a circuit design block) in other embodiments. In some embodiments, a stall prevention requirement may be translated or transformed from a forward progress property or an environment stall condition.

For example, a master side stall prevention requirement may be described as "M.BVALID & !M.BREADY|→##[1:20] M.BREADY". A slave side stall prevention requirement may be described as "S.OUTSTANDING_READ_REQ|→##[1:20] S.RVALID". In the aforementioned examples, "M" denotes master; "S" denotes slave; "BVALID" denotes a write response; and "RVALID" denotes a read response; "OUTSTANDING_READ_REQ" denotes an outstanding read request; and "BREADY" denotes a request has been served or a resource for processing the request has been released.

At 204, dependencies between stall prevention requirements may be determined in some embodiments. These identified dependencies may further be populated into a dependency database. A first requirement (e.g., a first SPR) may be considered to be dependent upon a second requirement (e.g., a second SPR) if the first requirement cannot complete until the second requirement is completed or releases resources. There is thus a dependency between the first requirement and the second requirement. In these embodiments, the dependencies identified at 202 indicates the dependencies at the top level (e.g., the switch fabric) of the electronic design to indicate, for example, which IP block is awaiting another IP block in order to complete the task (e.g., read data or write data) or to release the resources at the IP block.

The top level of an electronic design includes a plurality of blocks (e.g., IP blocks, macro blocks, etc.), one or more discrete components, and interconnects connecting the plurality of blocks and the one or more discrete components. At 206, a digraph (directed graph) may be determined with the determined dependencies between the stall prevention requirements in some embodiments. In some of these embodiments, the digraph may be determined by using the stall prevention requirements subject to these dependencies as the nodes and the dependencies connecting these nodes as the arcs and in the digraph. At 208, the verification suite (e.g., the verification suite 152 in FIG. 1A) may verify a block of circuit components by performing a loop analysis with the digraph to prove the presence or absence of a stall condition.

For example, the verification suite may determine whether a stall prevention requirement interacts with one or more other stall prevention requirements of one or more other blocks in such a way to cause a deadlock at the top level of the electronic design. In some embodiments, the verification suite may verify each block of circuit components independently. In these embodiments, the verification suite may verify the plurality of blocks in an electronic design either sequentially or in parallel to detect deadlock symptoms at the top level of the electronic design. For example, the verification suite may invoke a plurality of processor core, each of which verifies one block of circuit components and examines the dependencies between the set of stall prevention requirements of the block and one or more other sets of stall prevention requirements of one or more other blocks of circuit components. In these embodiments where these plurality of blocks are verified in parallel, the verification flow of the electronic design is more expedient due to the involvement of more computational resources.

Figure 3A:
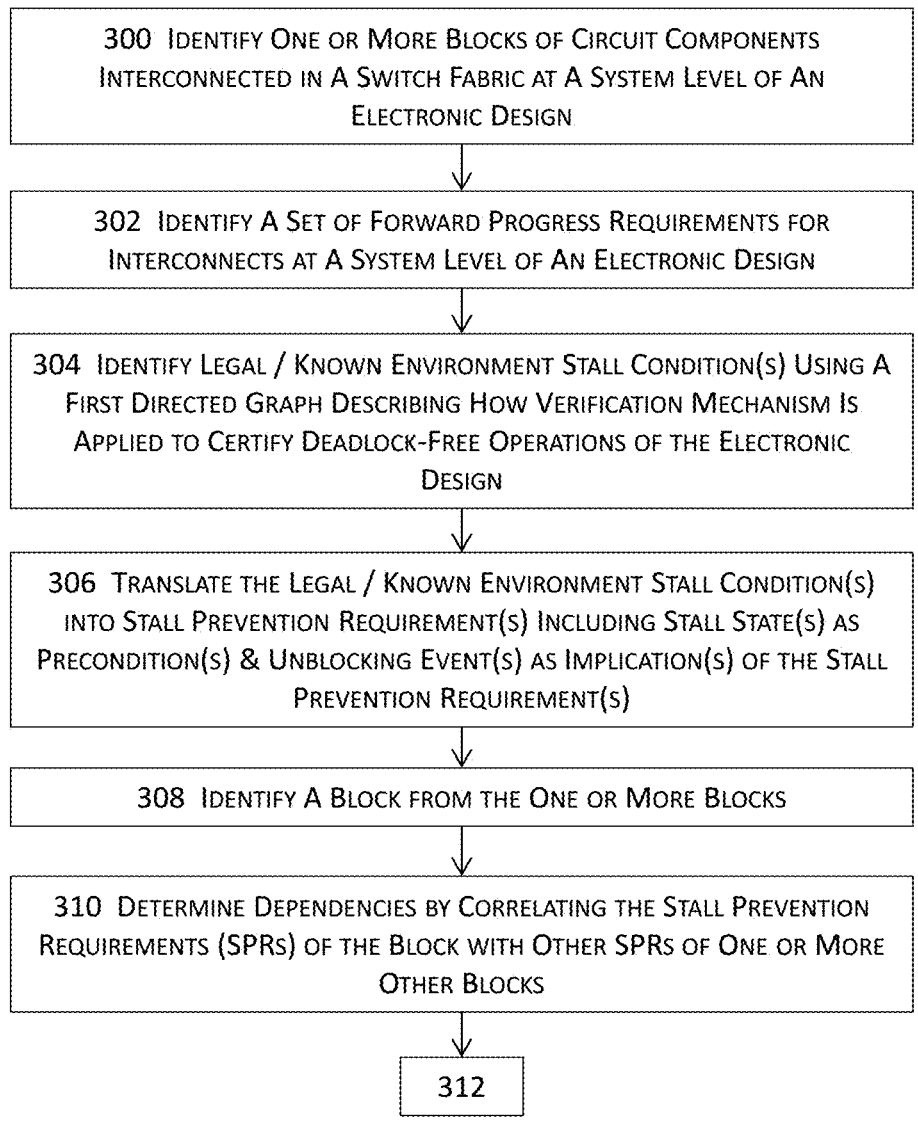
FIGS. 3A-B jointly illustrate a more detailed block diagram for a method or system for verifying an electronic design using stall prevention requirements of electronic design circuit models of the electronic design in one or more embodiments.
Figure 3B:
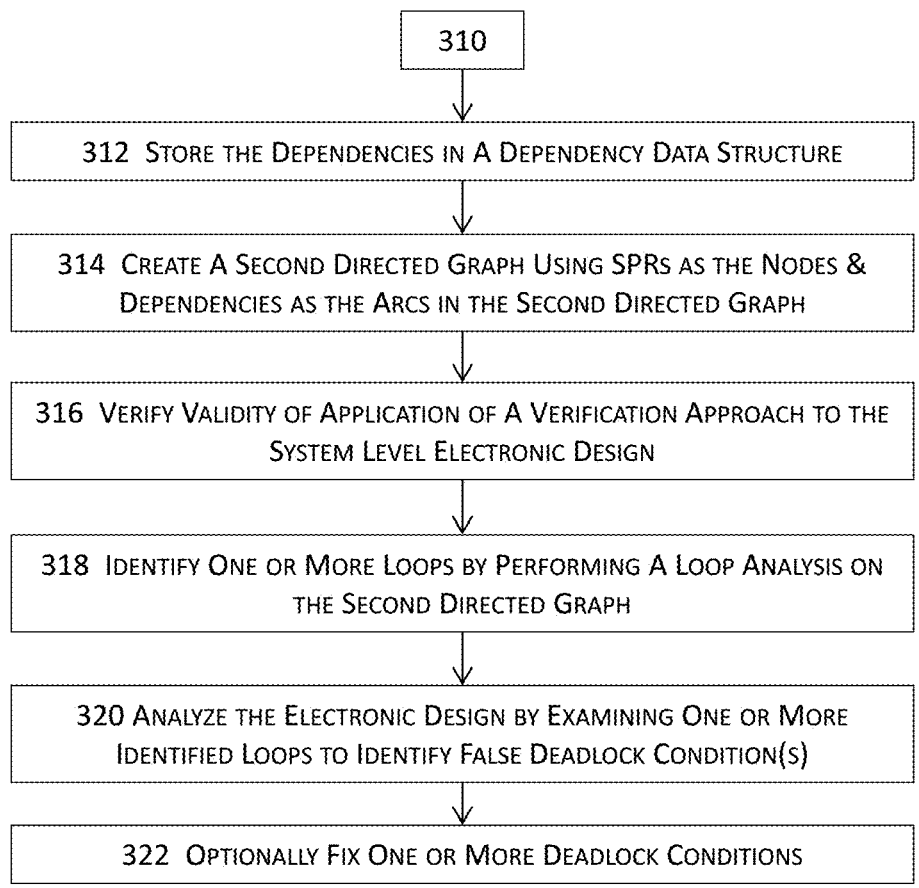

FIGS. 3A-B jointly illustrate a more detailed block diagram for a method or system for verifying an electronic design using stall prevention requirements of electronic design circuit models of the electronic design in one or more embodiments. In these one or more embodiments, one or more blocks of circuit components that are interconnected in a switch fabric at the system level of an electronic design may be identified at 300. In some embodiments, the method illustrated in FIGS. 3A-B may process a plurality of blocks in the electronic design sequentially or may identify and process multiple blocks in parallel. A block of circuit component may include a macro block, an IP block such as a bus architecture under the AXI protocol, or any other grouping of circuit component designs.

At 302, a set of forward progress requirements for interconnects at the system level of the electronic design may be identified. As similarly described above with reference to FIG. 2, a forward progress requirement may include, for example, one or more functional requirements, one or more bus compliance requirements, one or more deadlock free requirements, or any combinations thereof. A forward progress requirement may be protocol specific and may be expressed as an outstanding event indicator, a forward progress condition, an environment stall condition, an expected latency, or any combinations thereof. For example, a forward progress requirement may be specified as: OUTSTANDING_EVENTS|→## [latency] FORWARD_PROGRESS∥ENV_STALL.

A forward progress may be indicated by, for example, a transaction describing data or payload exiting a block (or describing legal completion of the transaction) or an action signal indicating data exiting a block or payload. In some other embodiments, a tracker may be used to track the forward progress of the data or payload, rather than using a transaction or an action signal to indicate whether the data or the payload has made forward progress. These forward progress requirements may be proven or disproven to identify stall conditions such as environment stall conditions.

At 304, one or more legal or known environment stall conditions may be identified in some embodiments. In some of these embodiments, at least some of the legal or known environment stall conditions may be identified by using a first digraph that describes how a verification approach or mechanism is applied to certify deadlock-free operations of the electronic design at 304. For example, the verification may identify these one or more legal or known environment stall conditions based in part upon how an assumption-guarantee verification technique is applied to certified deadlock-free operations of an electronic design. An environment stall condition includes a scenario where a legal or known deadlock or stall symptom is observed, but the interconnects at the system level are not the culprit or cause of the stall or deadlock.

For example, a slave client device accepts a read request from an interconnect but has not responded to the read request. In this example of an environment stall condition, the interconnect may block other incoming requests until the outstanding read request has been served and is thus not the cause of this deadlock or stall symptom because it is the slave device that has not responded to the read request although the interconnect appears to block further requests. As another example of an environment stall condition, a master client device sends write data ahead of issuing a write request, and the write request thus has not appeared. In this latter example, the stall or deadlock symptom has been observed because the interconnects may block the write data. Nonetheless, the interconnects are not the cause of the observed deadlock or stall symptom because it is the master client device that fails to send the write request prior to sending the write data. A practical example of a legal or known environment stall condition may include intentional drop or termination of a transaction or a task (e.g., a write task, a read task, etc.) because the intention drop or termination indicates a legal completion and hence forward progress of the transaction or task.

At 306, the identified one or more legal or known environment stall conditions may be translated or transformed into one or more stall prevention requirements. In some embodiments, the verification suite (e.g., the verification suite 152 of FIG. 1A) may identify and translate a stall condition or a stall state in a legal or known environment stall condition into a precondition of a stall prevention requirement and an unblocking event in the legal or known environment stall condition into an implication of the stall prevention requirement. At 308, a block of circuit components may be identified from the one or more blocks of circuit component designs identified at 300.

In some embodiments, a partition for independent analyses with various mechanisms illustrated in FIG. 3A may span across no more than two immediately connected blocks or cells (e.g., IP cells or blocks). Two blocks or cells are considered immediately connected if these two cells are interconnected with interconnects and one or more discrete components but not any other cells between the two cells. By analyzing or otherwise processing a block or cell independently to identify dependencies between the SPRs of the block or cell and one or more other SPRs of one or more other blocks or cells, corner cases can be easily identified, the coverage of verification flows with techniques described herein may be greatly enhanced, and guesswork as to what corner cases need to be considered may be effectively eliminated.

In addition, the set of stall prevention requirements corresponding to the identified block may also be identified at 308. The verification suite may determine dependencies by correlating the stall prevention requirements in the set corresponding to the identified block or cell with one or more other stall prevention requirements of one or more other blocks or cells of circuit component designs at 310. For example, the verification suite may identify a dependency between a first stall prevention requirement of a first client regarding serving a read request from another client device and a second stall prevention requirement of a second client regarding issuing a read request. In this example, the first client's serving a read request by, for example, sending data to the second client, depends upon the completion of the second client's issuance of the read request.

It shall be noted that a block or cell may be previously verified to be deadlock free, and that what remains to be verified is the implementation with the block or cell in the above example. In some embodiments where a block or cell has not been verified to be deadlock free, dependencies between the stall prevention requirements for the same block or cell may also be similarly determined. The verification suite may use the topological data, the address map, etc. to examine each stall prevention requirement of the identified block or cell against one or more other stall prevention requirements of one or more other blocks or cells to identify the dependencies for the block identified at 308.

In some transaction-based approach where various conditions and/or requirements are described in terms of transactions, the verification suite may use natural language processing techniques to identify dependencies between transactions, and to determine the second digraph using the transactions subject to the identified dependencies as nodes in the second digraph and the identified dependencies as the arcs interconnecting the nodes in the second digraph.

At 312 of FIG. 3B, the identified dependencies may be populated into a dependency database. In some embodiments, the dependency database includes dependencies between system level blocks or circuit components in the switch fabric where various blocks and discrete circuit components are interconnected with interconnects. At 314, a second digraph may be created. In some embodiments where the dependencies are determined based on the stall prevention requirements, the second digraph may be created to include the stall prevention requirements subject to the identified dependencies as the nodes in the second digraph and the identified dependencies connecting the stall prevention requirements as the arcs in the digraph.

At 316, the verification suite including or functioning in conjunction with at least processor (e.g., a central processing unit or CPU) may verify the validity of an application of a verification approach to the electronic design by, for example, examining how a verification approach is applied to certify deadlock-free operations. In some embodiments, a verification approach includes an assumption-guarantee verification approach. At 318, the verification suite may identify one or more loops by performing one or more loop analyses. In some of these embodiments illustrated in FIGS. 3A-B, the verification suite may perform the one or more loop analyses on the second digraph.

Depending upon whether the dependencies and hence the second digraph is based upon stall prevention requirements or transactions, the verification suite may perform the one or more loop analyses with an SPR loop analysis mechanism or transaction loop analysis mechanism. In some embodiments, the verification suite may perform a loop analysis on the dependency digraph by using the topological sort algorithm to identify and report one or more loops in the dependencies for debugging or fixing. At 320, the verification suite may further invoke a false deadlock mechanism (e.g., the false deadlock mechanism 160 of FIG. 1A) to analyze or examine the one or more identified loops to identify on or more false deadlock conditions.

For example, the verification suite may identify a loop in the dependency digraph and report that a loop representing a potential deadlock symptom has been identified. Nonetheless, the dependency loop may include two requirements (e.g., in a case of dependencies determined from stall prevention requirements) or two transactions (e.g., in a case of dependencies determined from transactions) that are mutually exclusive and thus cannot occur simultaneously. In this example, the verification suite may identify the false dependencies that do not actually represent a deadlock or stall condition.

The verification suite may further remove the false dependencies or the dependency loop from further debugging, analyses, or fixing. At 322, the one or more identified deadlock conditions may be forwarded for further debugging, analyses, or fixing. In some embodiments, the verification suite may further provide hints or recommendations for the potential or actual causes of a deadlock and/or for fixing the deadlock. For example, when provided with a deadlock, the verification suite may provide the possible or actual causes of the deadlock, recommendations on how to restrict the capability of one or more circuit blocks or components, recommendations on adding one or more additional agents (e.g., circuit blocks, etc.), or recommendations on architectural fix.

Figure 4A:
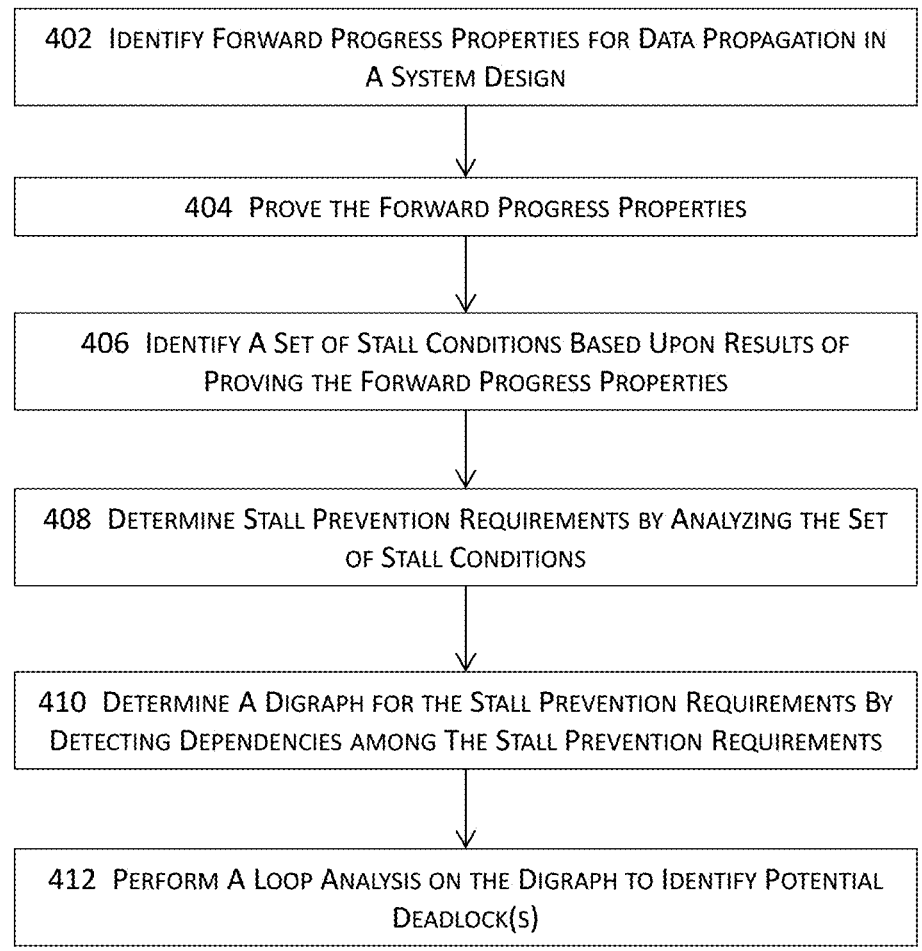
FIG. 4A illustrates another block diagram for a method or system for verifying an electronic design using stall prevention requirements of electronic design circuit models of the electronic design in one or more embodiments.

FIG. 4A illustrates another block diagram for a method or system for verifying an electronic design using stall prevention requirements of electronic design circuit models of the electronic design in one or more embodiments. In these one or more embodiments illustrated in FIG. 4A, one or more forward progress properties for data transport or data propagation may be identified in an electronic design at 402. In some of these embodiments, the one or more forward progress properties may include at least one forward progress property on interconnects at a top level (e.g., the system level) of the electronic design. With the identified one or more forward progress properties, the verification suite (e.g., the verification suite 152 of FIG. 1A) may identify one or more stall conditions by proving or disproving these one or more forward progress properties. A forward progress property indicates the forward progress of data or a payload in the data transport or data propagation in some embodiments.

At 404, the one or more identified forward progress properties may be proven or disproven. Various pieces of information or data including helper assertions and/or trace information that may be determined from, for example, analyzing the fan-out or only the relevant portion of the fan-out of the logic controlling the forward progress of a payload may be used to help or aid the proof or disproof of forward progress properties. At 406, a verification suite (e.g., the verification suite 152 of FIG. 1A) may identify a set of stall conditions based in part or in whole upon the results of proving or disproving the one or more identified forward progress properties. A set of stall prevention requirements may then be determined at 408 by analyzing the set of stall conditions.

A deadlock condition or a stall condition includes the determination or proof of the absence of a transaction or a payload exiting a circuit block or the lack of forward progress indicated by an action signal or by a tracker tracking the progress of the transaction or payload. For example, a forward progress property may include the property where a valid signal related to a payload (e.g., a payload in a payload buffer) transitions from "0" (indicating an invalid signal) to "1" indicating a valid signal.

In some of these embodiments illustrated in FIG. 4A, each block of circuit component designs may be analyzed individually or independently in order to divide and conquer the complexity and/or large scale of an electronic design. In these embodiments, the plurality of blocks may be analyzed sequentially or in parallel. At 410, a digraph may be determined for the stall prevention requirements by detecting and capturing dependencies between the stall prevention requirements of a block and one or more other stall prevention requirements of one or more other blocks. Detecting and capturing dependencies between a set of SPRs of a block and one or more other sets of SPRs of one or more other blocks may also be performed sequentially or in parallel to improve the efficiency of a verification flow.

The flow at 410 links stall prevention requirements that are used in the forward progress in a form of, for example, a directed graph to certify the validity of the verification approach (e.g., the assumption-guarantee approach) across multiple interfaces in the electronic design. At 412, one or more loop analyses may be performed to identify one or more potential or possible deadlocks in the electronic design. For example, the verification suite may perform a loop analysis on the digraph determined at 410 to identify one or more potential or possible deadlocks. The verification suite may further identify and eliminate one or more false deadlocks from further debugging, analyses, or fixing in identical or substantially similar manner as those described above with reference to FIG. 3B.

Figure 4B:
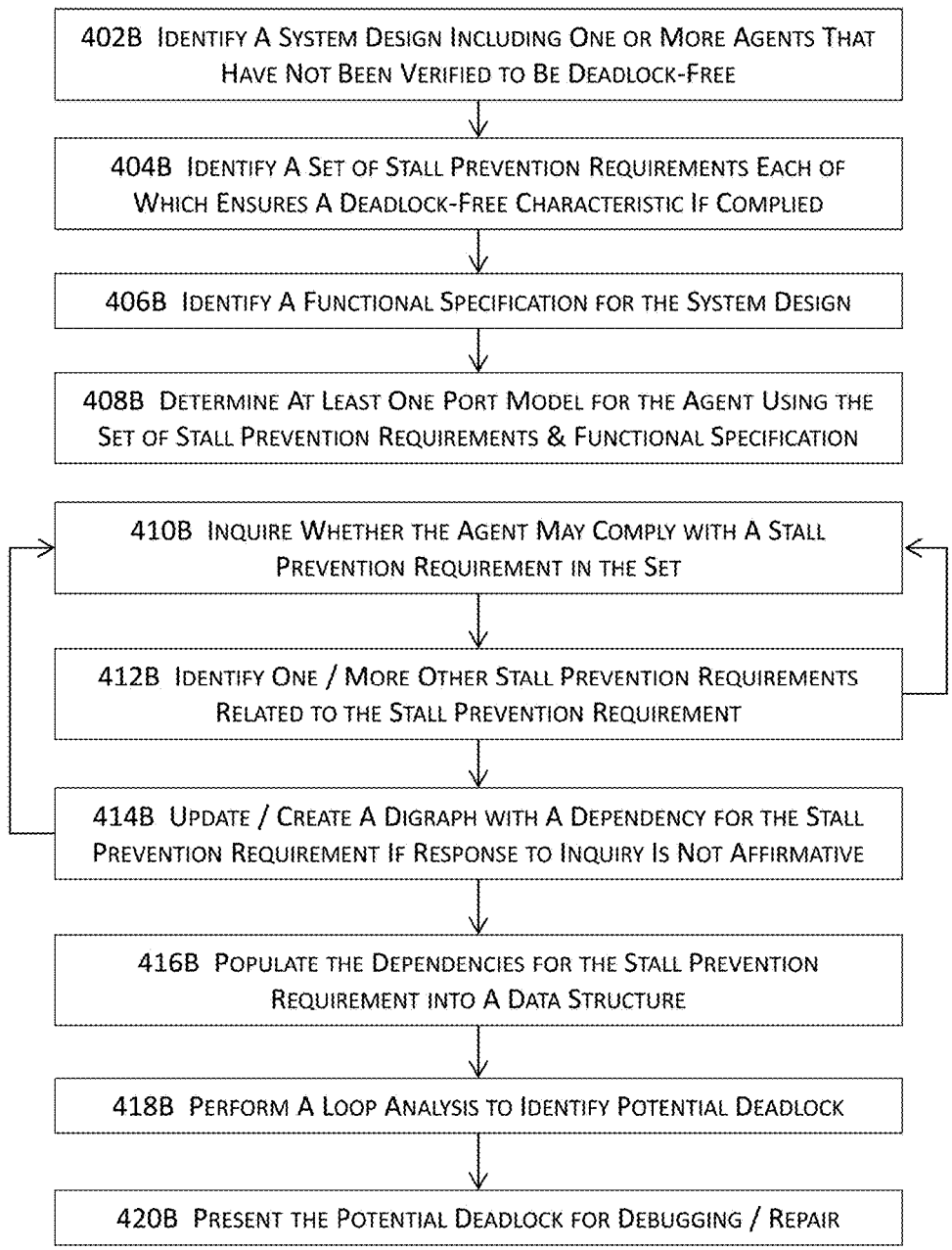
FIG. 4B illustrates another block diagram for a method or system for verifying an electronic design using stall prevention requirements of electronic design circuit models of the electronic design in one or more embodiments.

FIG. 4B illustrates another block diagram for a method or system for verifying an electronic design using stall prevention requirements of electronic design circuit models of the electronic design in one or more embodiments. In these one or more embodiments illustrated in FIG. 4B, an electronic design including one or more agents (e.g., a block, a circuit component, etc.) that have not been verified to be deadlock free may be identified at 402B. The electronic design may include an RTL design of an SoC design in some embodiments.

At 404B, a set of stall prevention requirements, each of which ensures deadlock free characteristics or operations if complied with, may be identified. A functional specification for the electronic design may be identified at 406B. A functional specification describes the requested behavior of the electronic design to be verified. A functional specification may not define or specify the inner workings of the electronic design or include the specification how the functions of the electronic design may be implemented in some embodiments.

In these embodiments, the functional specification may focus on what outside agents (e.g., designers using the verification suite, peripherals of a computer system performing various tasks described herein, or other computers, etc.) may observe when these outside agents interact with the computer system upon which the verification suite is executing. A functional specification may further describe what is to be implemented and may be cross referenced to a system architecture specification that describes how the functions may be realized using a software environment and may also be identified at 406B.

Some examples of functional specifications may include the advanced microcontroller bus architecture, extensible firmware interface, multi-boot specification, real-time specification, or a UNIX specification, etc. At 408B, at least one port model for an agent may be determined by using the set of stall prevention requirements and the identified functional specification. In some embodiments, the at least one port model may include the set of stall prevention requirements and may be protocol specific due to the protocol specific characteristic of some stall prevention requirements. At 410B, the agent may be inquired to determine whether or not the agent may comply with a specific stall prevention requirement in the set of stall prevention requirements.

One or more other stall prevention requirements that are related to the stall prevention requirement in 410B may be further identified at 412B, and a directed graph indicating the dependencies between stall prevention requirements may be updated or created if the response to the inquiry of 410B is not affirmative. For example, an agent may respond negatively to an inquiry of whether the agent may comply with a first stall prevention requirement. In this example, one or more other stall prevention requirements that related to the first stall prevention requirement may be identified at 412B.

The first stall prevention requirement and these one or more other stall prevention requirements may be used at 414B to update or create the dependency digraph. A stall prevention requirement is related to another stall prevention requirement if there exists a dependency between the two stall prevention requirements in some embodiments. The process may return to 410B to inquire the agent whether or not the agent may comply with another stall prevention requirement and repeat the processes 410B-414B until all the stall prevention requirements of interest have been processed. At 416B, the dependencies for the stall prevention requirement may be populated into a data structure such as a system level dependency data structure.

At 418B, one or more loop analyses may be performed on the digraph to identify one or more loops among the dependencies as potential or possible deadlocks. At 420B, at least some of these potential or possible deadlocks (e.g., the deadlocks after the elimination of false deadlocks) may be presented for further debugging, analyses, or fixing in identical or substantially similar manners as described above with reference to FIG. 3B.

System Architecture Overview

FIG. 5 illustrates a block diagram of a simplified illustration of a specially programmed computing system 500 on which a method for verifying an electronic design using stall prevention requirements of electronic design circuit models of the electronic design as described in the preceding paragraphs with reference to various figures. Computer system 500 includes a bus 506 (e.g., a system bus, an external bus, etc.) or other communication mechanisms for communicating information, which interconnects subsystems and devices, such as processor 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown).

According to one embodiment, computer system 500 performs specific operations by one or more processor or processor cores 507 executing one or more sequences of one or more instructions in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, the act of determining and/or storing dependencies, the act of determining a directed graph, the act of verifying an electronic circuit design or a block thereof, the act of identifying a set of forward progress requirements and/or legal or known environment stall conditions, the act of verifying of application of a verification approach, the act of performing a loop analysis, and/or the act of fixing a deadlock condition, etc. may be performed by one or more processors, one or more processor cores, or combination thereof. A mechanisms described herein may also be implemented as a pure hardware module (e.g., a block of electronic circuit components) or a combination of a hardware module and a software block that jointly perform various tasks to achieve various functions or purposes described herein or equivalents thereof. For example, a mechanism described herein may be implemented as an application-specific integrated circuit (ASIC) in some embodiments. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any medium that participates in providing instructions to processor 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500. According to other embodiments of the invention, two or more computer systems 500 coupled by communication link 515 (e.g., LAN, PTSN, or wireless network) may perform the sequence of instructions required to practice the invention in coordination with one another.

Computer system 500 may transmit and receive messages, data, and instructions, including program, i.e., application code, through communication link 515 and communication interface 514. Received program code may be executed by processor 507 as it is received, and/or stored in disk drive 510, or other non-volatile storage for later execution. In an embodiment, the computer system 500 operates in conjunction with a data storage system 531, e.g., a data storage system 531 that includes a database 532 that is readily accessible by the computer system 500. The computer system 500 communicates with the data storage system 531 through a data interface 533. A data interface 533, which is coupled to the bus 506 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 533 may be performed by the communication interface 514.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for verifying an electronic design using stall prevention requirements of electronic design circuit models of the electronic design, comprising:

configuring at least a stall prevention requirement generation module function in tandem with at least one microprocessor to perform a process, the process comprising:

identifying one or more blocks of circuit component designs of an electronic design and one or more sets of stall prevention requirements corresponding to the one or more blocks;

determining dependencies between stall prevention requirements;

generating a graph for the dependencies at least by correlating the stall prevention requirements with one another; and verifying the electronic design with at least a false deadlock module that analyzes one or more loops identified from the graph to detect at least one false deadlock in one or more potential deadlocks identified from the one or more loops.

2. The computer implemented method of claim 1, wherein the electronic design model comprises a register transfer level (RTL) electronic design, and the one or more blocks of circuit component designs are interconnected in a switch fabric at a system level of the register transfer level electronic design.

3. The computer implemented method of claim 1, further comprising:

identifying one or more forward progress requirements for interconnects connecting the one or more blocks in the electronic design; and identifying one or more environment stall conditions by proving or disproving the one or more environment stall conditions with the at least one processor.

4. The computer implemented method of claim 3, further comprising:

identifying a first block from the one or more blocks; and identifying a first transaction for data transport involving the first block with the at least one processor that identifies a first specification of data in the data transport entering or exiting the first block.

5. The computer implemented method of claim 4, further comprising:

identifying one or more other transactions for one or more other blocks with the at least one processor that identifies a specification of the data in the data transport entering or exiting the one or more other blocks; and determining dependencies between the first transaction for the data transport involving the first block and the one or more other transactions for the data transport involving the one or more other blocks in the electronic design.

6. The computer implemented method of claim 3, further comprising:

identifying a first block from the one or more blocks; and identifying a stall prevention requirement for the first block with the at least one processor that transforms an environment stall condition of the one or more environment stall conditions into the stall prevention requirement.

7. The computer implemented method of claim 6, identifying the stall prevention requirement for the first block comprising:

identifying a stall state involving the first block with the at least one processor that processes the environment stall condition to retrieve the stall state associated with or in the environment stall condition;

identifying an unblocking event corresponding to the stall state with the at least one processor that processes the environment stall condition to retrieve the unblocking event associated with or in the environment stall condition;

transforming information about the stall state into a precondition of the stall prevention requirement; and transforming information about the unblocking event into an implication of the stall prevention requirement.

8. The computer implemented method of claim 6, in which determining the dependencies is performed sequentially for the one or more blocks in the electronic design, the one or more blocks includes at least one cell that has been proven to perform the data transport across or in the at least one cell is deadlock free, and the data transport that is deadlock free across or in the at least one cell does not ensure that the data transport in or out of the at least one cell in the electronic design is deadlock free.

9. The computer implemented method of claim 6, further comprising:

identifying one or more other stall prevention requirements for one or more other blocks with the at least one processor that transforms one or more other environment stall conditions of the one or more environment stall conditions for the one or more other blocks into the one or more stall prevention requirements.

10. The computer implemented method of claim 9, further comprising:

determining dependencies between the stall prevention requirement for the first block and the one or more other stall prevention requirements for the one or more other blocks in the electronic design.

11. The computer implemented method of claim 10, determining the graph further comprising:

determining a plurality of nodes in the graph with the at least one processor that identifies and transforms the stall prevention requirement and the one or more other stall prevention requirements into the plurality of nodes; and determining a plurality of arcs connecting the plurality of nodes in the graph with the at least one processor that identifies and transforms the dependencies into the plurality of nodes.

12. The computer implemented method of claim 1, further comprising:

detecting one or more potential deadlocks in the electronic design with the at least one processor that performs one or more loop analyses on the graph and identifies the one or more potential deadlocks based in part or in whole upon results of the one or more loop analyses.

13. The computer implemented method of claim 12, further comprising:

identifying zero or more false deadlocks in the electronic design with the at least one processor that examines the one or more potential deadlocks to identify the zero or more false deadlocks; and trimming a processing space to a smaller processing space with the at least one processor that eliminates the zero or more false deadlocks from further processing and reports one or more remaining potential deadlock for debugging, analysis, or fixing.

14. An article of manufacture comprising a non-transitory computer accessible storage medium having stored thereupon a sequence of instructions which, when executed by at least one processor, causes the at least one processor to perform a process for verifying an electronic design using stall prevention requirements of electronic design circuit models of the electronic design, the process comprising:

identifying one or more blocks of circuit component designs of an electronic design and one or more sets of stall prevention requirements corresponding to the one or more blocks by using at least one processor;

determining dependencies between stall prevention requirements with the at least one processor;

generating a graph for the dependencies at least by correlating the stall prevention requirements with one another; and verifying the electronic design with at least a false deadlock module that analyzes one or more loops identified from the graph to detect at least one false deadlock in one or more potential deadlocks identified from the one or more loops.

15. The article of manufacture of claim 14, further comprising the sequence of instructions which, when executed by at least one processor, causes the at least one processor to perform the process that further comprises:

identifying a first block from the one or more blocks; and identifying a stall prevention requirement for the first block with the at least one processor that transforms an environment stall condition of the one or more environment stall conditions into the stall prevention requirement.

16. The article of manufacture of claim 15, further comprising the sequence of instructions which, when executed by at least one processor, causes the at least one processor to perform the process that further comprises:
identifying a stall state involving the first block with the at least one processor that processes the environment stall condition to retrieve the stall state associated with or in the environment stall condition;
identifying an unblocking event corresponding to the stall state with the at least one processor that processes the environment stall condition to retrieve the unblocking event associated with or in the environment stall condition;
transforming information about the stall state into a precondition of the stall prevention requirement; and
transforming information about the unblocking event into an implication of the stall prevention requirement.

17. The article of manufacture of claim 14, further comprising the sequence of instructions which, when executed by at least one processor, causes the at least one processor to perform the process that further comprises:
detecting one or more potential deadlocks in the electronic design with the at least one processor that performs one or more loop analyses on the graph and identifies the one or more potential deadlocks based in part or in whole upon results of the one or more loop analyses.

18. A system for verifying an electronic design with a graph-based verification flow, comprising:
non-transitory computer accessible storage medium storing thereupon program code;
a verification suite comprising at least one processor that executes the program code to identify one or more blocks of circuit component designs of an electronic design and one or more sets of stall prevention requirements corresponding to the one or more blocks into the non-transitory computer accessible storage medium via one or more bus architectures;
the verification suite further configured to execute the program code to determine dependencies between stall prevention requirements;
the verification suite further configured to execute the program code to generate a graph for the dependencies at least by correlating the stall prevention requirements with one another; and the verification suite further configured to execute the program code to verify the electronic design with at least a false deadlock module that analyzes one or more loops identified from the graph to detect at least one false deadlock in one or more potential deadlocks identified from the one or more loops.

19. The system of claim 18, further comprising
the verification suite further configured to execute the program code to identify a first block from the one or more blocks, and to identify a stall prevention requirement for the first block with the at least one processor that transforms an environment stall condition of the one or more environment stall conditions into the stall prevention requirement.

20. The system of claim 19, further comprising
the verification suite further configured to execute the program code to identify a stall state involving the first block with the at least one processor that processes the environment stall condition to retrieve the stall state associated with or in the environment stall condition;
the verification suite further configured to execute the program code to identify an unblocking event corresponding to the stall state with the at least one processor that processes the environment stall condition to retrieve the unblocking event associated with or in the environment stall condition;
the verification suite further configured to execute the program code to transform information about the stall state into a precondition of the stall prevention requirement; and
the verification suite further configured to execute the program code to transform information about the unblocking event into an implication of the stall prevention requirement.

21. The system of claim 18, further comprising
the verification suite further configured to execute the program code to detect one or more potential deadlocks in the electronic design with the at least one processor that performs one or more loop analyses on the graph and identifies the one or more potential deadlocks based in part or in whole upon results of the one or more loop analyses.

* * * * *